US009165901B2

(12) United States Patent
Satou et al.

(10) Patent No.: US 9,165,901 B2
(45) Date of Patent: Oct. 20, 2015

(54) SEMICONDUCTOR DEVICE

(71) Applicant: RENESAS ELECTRONICS CORPORATION, Tokyo (JP)

(72) Inventors: Yukihiro Satou, Kawasaki (JP); Toshiyuki Hata, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/331,289

(22) Filed: Jul. 15, 2014

(65) Prior Publication Data
US 2014/0332866 A1 Nov. 13, 2014

Related U.S. Application Data

(60) Continuation of application No. 13/628,899, filed on Sep. 27, 2012, now Pat. No. 8,796,838, which is a continuation of application No. 12/805,113, filed on Jul. 13, 2010, now Pat. No. 8,304,890, which is a
(Continued)

(30) Foreign Application Priority Data

Jun. 30, 2003 (JP) ................. 2003-187377

(51) Int. Cl.
*H01L 23/48* (2006.01)
*H01L 23/52* (2006.01)
(Continued)

(52) U.S. Cl.
CPC ............ *H01L 24/49* (2013.01); *H01L 23/3142* (2013.01); *H01L 23/4952* (2013.01);
(Continued)

(58) Field of Classification Search
USPC ...................... 257/E23.037, E23.07
See application file for complete search history.

(56) References Cited

U.S. PATENT DOCUMENTS 4,631,805 A 12/1986 Olsen et al.
4,984,063 A 1/1991 Terashima
(Continued)

FOREIGN PATENT DOCUMENTS

EP 1079434 2/2001
JP 02-087535 3/1990
(Continued)

OTHER PUBLICATIONS

Office Action from Japanese Patent Office in corresponding Japanese Application No. 2011-086201, dated Jul. 25, 2013, pp. 1-2 in Japanese; pp. 1-8 in its English translation.
(Continued)

*Primary Examiner* — Daniel Whalen
(74) *Attorney, Agent, or Firm* — Nicholas Trenkle; Stites & Harbison, PLLC.

(57) ABSTRACT

A semiconductor device includes a header, a semiconductor chip fixed to the header constituting a MOSFET, and a sealing body of insulating resin which covers the semiconductor chip, the header and the like, and further includes a drain lead contiguously formed with the header and projects from one side surface of the sealing body, and a source lead and a gate lead which project in parallel from one side surface of the sealing body, and wires which are positioned in the inside of the sealing body and connect electrodes on an upper surface of the semiconductor chip and the source lead and the gate lead, with a gate electrode pad arranged at a position from the gate lead and the source lead farther than a source electrode pad.

7 Claims, 13 Drawing Sheets

Related U.S. Application Data continuation of application No. 12/453,043, filed on Apr. 28, 2009, now Pat. No. 7,800,215, which is a continuation of application No. 11/450,333, filed on Jun. 12, 2006, now Pat. No. 7,541,672, which is a division of application No. 10/823,734, filed on Apr. 14, 2004, now Pat. No. 7,084,491.

(51) Int. Cl.
  *H01L 23/00* (2006.01)
  *H01L 23/495* (2006.01)
  *H01L 23/31* (2006.01)

(52) U.S. Cl.
  CPC .... *H01L23/49524* (2013.01); *H01L 23/49562* (2013.01); *H01L 24/06* (2013.01); *H01L 24/37* (2013.01); *H01L 24/40* (2013.01); *H01L 24/97* (2013.01); *H01L 24/45* (2013.01); *H01L 24/48* (2013.01); *H01L 2224/04034* (2013.01); *H01L 2224/04042* (2013.01); *H01L 2224/05124* (2013.01); *H01L 2224/05155* (2013.01); *H01L 2224/05553* (2013.01); *H01L 2224/05624* (2013.01); *H01L 2224/05639* (2013.01); *H01L 2224/05644* (2013.01); *H01L 2224/0603* (2013.01); *H01L 2224/37124* (2013.01); *H01L 2224/40247* (2013.01); *H01L 2224/45014* (2013.01); *H01L 2224/45015* (2013.01); *H01L 2224/45124* (2013.01); *H01L 2224/4846* (2013.01); *H01L 2224/48091* (2013.01); *H01L 2224/48247* (2013.01); *H01L 2224/48472* (2013.01); *H01L 2224/48724* (2013.01); *H01L 2224/4903* (2013.01); *H01L 2224/4912* (2013.01); *H01L 2224/49051* (2013.01); *H01L 2224/49111* (2013.01); *H01L 2224/49171* (2013.01); *H01L 2224/49175* (2013.01); *H01L 2224/49431* (2013.01); *H01L 2224/73221* (2013.01); *H01L 2224/97* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01022* (2013.01); *H01L 2924/01023* (2013.01); *H01L 2924/01028* (2013.01); *H01L 2924/01029* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/1305* (2013.01); *H01L 2924/1306* (2013.01); *H01L 2924/13055* (2013.01); *H01L 2924/13091* (2013.01); *H01L 2924/1811* (2013.01); *H01L 2924/2076* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/20758* (2013.01); *H01L 2924/20759* (2013.01)

(56) References Cited

U.S. PATENT DOCUMENTS

| | | | |
|---|---|---|---|
| 5,629,542 | A | 5/1997 | Sakamoto et al. |
| 5,666,009 | A | 9/1997 | Kumano et al. |
| 6,040,626 | A | 3/2000 | Cheah et al. |
| 6,307,272 | B1 | 10/2001 | Takahashi et al. |
| 6,534,878 | B1 | 3/2003 | Sander et al. |
| 6,667,547 | B2 | 12/2003 | Woodworth et al. |
| 6,882,047 | B2 | 4/2005 | Hata et al. |
| 6,906,386 | B2 | 6/2005 | Williams et al. |
| 7,084,491 | B2 | 8/2006 | Satou et al. |
| 7,138,673 | B2 | 11/2006 | Tanaka |
| 7,183,616 | B2 | 2/2007 | Bhalla et al. |
| 8,304,890 | B2 | 11/2012 | Satou et al. |
| 2001/0050422 | A1 | 12/2001 | Kishimoto et al. |
| 2002/0047187 | A1 | 4/2002 | Nakajima et al. |
| 2003/0062608 | A1* | 4/2003 | Hamachi ................ 257/676 |
| 2004/0217488 | A1 | 11/2004 | Luechinger |
| 2007/0172980 | A1 | 7/2007 | Tanaka et al. |
| 2008/0265386 | A1 | 10/2008 | Muto et al. |

FOREIGN PATENT DOCUMENTS

| | | |
|---|---|---|
| JP | 03-232246 | 10/1991 |
| JP | 05-166984 | 7/1993 |
| JP | H6-333976 | 12/1994 |
| JP | 10-261756 | 9/1998 |
| JP | 2000-49184 | 2/2000 |
| JP | 2000-77588 | 3/2000 |

OTHER PUBLICATIONS

Office Action dated Jun. 5, 2014 in corresponding Japanese Application No. 2013-188170.

Office Action dated Sep. 3, 2015 in corresponding Japanese Application no. 2014-218996 No -.

English Translation of Office Action dated Sep. 3, 2015 in corresponding Japanese Application No. 2014-218996.

* cited by examiner

US 9,165,901 B2

SEMICONDUCTOR DEVICE

CROSS-REFERENCE TO RELATED APPLICATION

This application is a Continuation of U.S. application Ser. No. 13/628,899 filed Sep. 27, 2012, which is a Continuation of U.S. application Ser. No. 12/805,113 filed Jul. 13, 2010, which is a Continuation of U.S. application Ser. No. 12/453,043 filed Apr. 28, 2009, which is a Continuation of U.S. application Ser. No. 11/450,333 filed Jun. 12, 2006, which is a Divisional application of U.S. application Ser. No. 10/823,734 filed Apr. 14, 2004, the content of which is hereby incorporated by reference into this application.

BACKGROUND OF THE INVENTION

The present invention relates to a semiconductor device, and more particularly to a technique which is effectively applicable to a semiconductor device which seals a power source transistor chip such as a power MOSFET, an IGBT (Insulated Gate Bipolar Transistor), a bipolar power transistor or the like. The above-mentioned semiconductor device is used in portable equipment, a laser beam printer, automobile installed electric equipment or the like.

As a power source transistor used in a charger of a mobile telephone, a video camera or the like, a power source circuit of office automation (OA) equipment, automobile installed electric equipment, a low-voltage drive power transistor has been known (see Japanese Patent Application Laid-Open No. 2000-49184 (patent literature 1), for example).

Further, there has been also proposed a high power MOSFET whose JIS package profile assumes a 10220 type or a 10247 type (see Japanese Patent Application Laid-Open No. 2000-77588 (patent literature 2), for example).

SUMMARY OF THE INVENTION

The TO220 type semiconductor device (package) 90 has an profile shape shown in FIG. 23 and FIG. 24. FIG. 23 is a plan view of package and FIG. 24 is a side view of the package. An upper-surface side of a metal-made support board 91 which is referred to as a header is covered with a sealing body 92 made of insulating resin. Three leads 93 to 95 project from the sealing body 92 in parallel to each other. The leads 93 to 95 are constituted of a gate (G) lead, a drain (D) lead and a source (S) lead. Further, the center lead 94 is offset in the inside of the sealing body 92 and is integrally formed with the header 91. Although not shown in the drawing, a semiconductor chip in which a MOSFET is formed is fixed to an upper surface of the header 91. A back surface of the semiconductor chip constitutes a drain electrode and is electrically connected with the header 91. Further, a gate electrode pad and a source electrode pad are formed on an upper surface of the semiconductor chip. The gate electrode pad, the source electrode pad, and wire connecting portions (lead posts) of the gate lead 93 and the source lead 95 are connected with each other using conductive wires.

FIG. 25 and FIG. 26 show a TO220 type semiconductor device which inventors of the present inventions have studied before the inventors have arrived at the present invention. FIG. 25 is a schematic plan view of the semiconductor device in a state that a resin sealing body is removed, and FIG. 26 is a cross-sectional view of the semiconductor device corresponding to FIG. 25. In FIG. 25 and FIG. 26, to indicate respective parts, with respect to the constitution which is common with the constitution shown in FIG. 23 and FIG. 24, the same reference numerals are used as it is.

A header 91 includes a mounting hole 96 for fixing a package 90 to a mounting board. A semiconductor chip 97 is fixed to a region inside a V-shaped groove frame 98 formed in a rectangular ring shape by means of an adhesive material.

A gate electrode pad 99 and a source electrode pad 100 are mounted on an upper surface (first main surface) of the semiconductor chip 97. The gate electrode pad 99 and a wire connecting portion (lead post) 93a of a gate lead 93 are connected with each other by a conductive wire 101, while a source electrode pad 100 and a wire connecting portion 95a of a source lead 95 are connected with each other by a conductive wire 102. To reduce the ON resistance, two wires 102 are used for connecting the source electrode pad 100 and the source lead 95. These wires 102 are respectively formed of a bold line (aluminum line having a diameter of 30 to 500 μm, for example) compared to the wires 101 (aluminum line having a diameter of 125 μm, for example) which connect the gate electrode pad 99 and the gate lead 93.

Although an insulating protective film is formed on the upper surface of the semiconductor chip 97, respective electrodes are exposed at bottoms of opening portions which are formed by partially removing the protective film and these exposed portions constitute the gate electrode pad 99 and the source electrode pad 100. The source electrode pad 100 is formed with a large width to allow the connection of two wires. That is, the source electrode pad 100 is formed in an elongated manner in the direction orthogonal to the extending direction of the leads. The source electrode pad 100 is formed substantially at the center of the semiconductor chip 97. Since the fine wire is connected to the gate electrode pad 99, the gate electrode pad 99 is sufficiently small compared to the source electrode pad 100. Further, as also described in the patent literature 2, the gate electrode pad 99 is provided at a corner of the semiconductor chip 97 and at a position close to the lead post 93a which constitutes a distal end of the gate lead 93. That is, the gate electrode pad 99 is arranged close to the lead posts 93a, 95a of the leads 93, 95 than the source electrode pad 100. In other words, the gate electrode pad 99 is positioned between the gate lead post 93a and the source electrode pad 100.

However, when the gate electrode pad 99 is configured to be arranged at the corner side of the semiconductor chip 97 close to the lead posts, along with the increase of a chip size of the semiconductor chip, the gate electrode pad 99 and the lead post 93a become further closer to each other. Accordingly, at the time of performing the wire bonding in the package manufacturing step, a bonding tool is brought into contact with a stepped portion of the lead and hence, bonding becomes difficult. That is, the wire bonding is ultrasonic wave bonding which uses a wedge bonding tool and hence, at the time of connecting one end of the wire to the gate electrode pad 99 as the first bonding, the bonding tool (capillary) which holds the wire is brought into contact with the gate lead post 93a. Accordingly, the ultrasonic vibration cannot be effectively applied to the wire bonding portion and hence, it is difficult to perform the highly reliable wire bonding.

Further, the source lead 95 is arranged at the outside of the package and the source electrode pad 100 is arranged at the center side of the package and hence, the source wire 102 extends in the direction which intersects the direction that the lead extends.

Accordingly, compared to a case in which the source wire 102 is formed to extend in the direction that the lead extends, it is necessary to increase a pitch between the source wires 102 and hence, it is difficult to form a large number of source wires 102.

Still further, as the wire 102 which is connected to the source electrode pad 100, a wire having a large diameter of 30 to 500 μm is used as described above and hence, the number of wires which are connected with the source electrode pad and the lead post 95a is limited whereby lowering of the ON resistance of the package is also limited.

It is an object of the present invention to provide a semiconductor device having low ON resistance.

It is another object of the present invention to provide a semiconductor device which can fix a semiconductor chip having a larger size onto a support board.

It is still another object of the present invention to provide a manufacturing method of a semiconductor device which exhibits the high electric reliability.

The above-mentioned object, other objects and novel features of the present invention will become apparent from the description of this specification and attached drawings.

To briefly explain the summary of typical inventions among the inventions disclosed in this specification, they are as follows.

(1) The semiconductor device of the present invention includes a metal-made support board which has at least a portion thereof covered with a sealing body made of insulating resin and has a lower surface thereof exposed from the sealing body thus constituting a first electrode, a first electrode lead which is contiguously formed with the support board and projects from one side surface of the sealing body, a second electrode lead and a control electrode lead which project from the above-mentioned one side surface of the sealing body and extend parallel to the first electrode lead, a semiconductor chip which is covered with the sealing body, has a first electrode on a lower surface thereof, has a second electrode pad and a control electrode pad on an upper surface thereof, and has a lower surface thereof fixed to the support board by a conductive bonding material, connecting means which is positioned in the inside of the sealing body and electrically connects the second electrode pad and the second electrode lead, and connecting means which is positioned in the inside of the sealing body and electrically connects the control electrode pad and the control electrode lead, wherein the second electrode pad is arranged at a position close to the control electrode lead and the second electrode lead and the control electrode pad is arranged at a position far from the control electrode lead and the second electrode lead.

A field effect transistor is incorporated into the semiconductor chip, wherein the first electrode lead constitutes a drain lead thereof, the control electrode lead constitutes a gate lead thereof and the second electrode lead constitutes a source lead. One side of the semiconductor chip which has a quadrangular shape faces the lead posts of the gate lead and the source lead in an opposed manner, and a gate electrode pad is positioned at one corner portion of a semiconductor chip contiguously with a side opposite to the opposingly facing surface.

The gate electrode pad and the gate lead are connected with each other using one wire, the source electrode pad and the source lead are connected using a plurality of wires, and the plurality of wires have a larger diameter and a shorter length than the wire which connects the gate electrode pad and the gate lead.

(2) In the above-mentioned constitution (1), the source electrode pad and the source lead have large widths, and the source electrode pad and the source lead are formed of a conductive plate having a wide width which is formed of a resilient metal plate molded in a ribbon strap or in a given shape.

DESCRIPTION OF THE PREFERRED EMBODIMENTS

Hereinafter, embodiments of the present invention are explained in detail in conjunction with drawings. Here, in the whole drawings for explaining the embodiments of the invention, parts having identical functions are given same symbols and the repeated explanations thereof are omitted.

Embodiment 1

Figure 1:
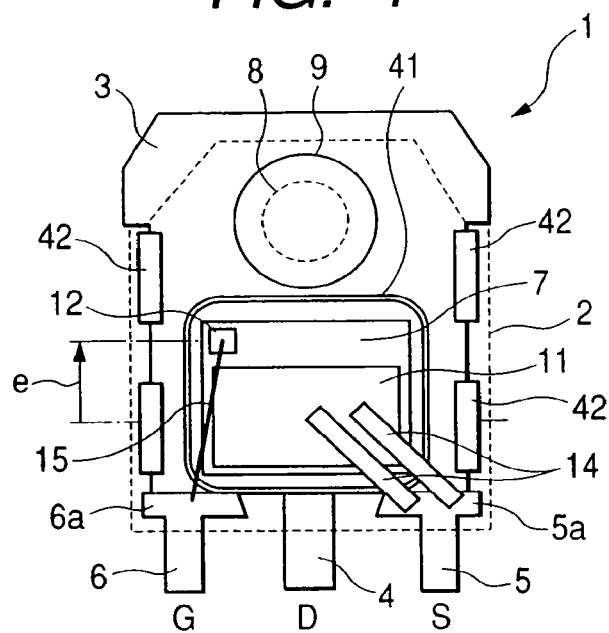
FIG. 1 is a schematic plan view of a semiconductor device according to one embodiment (embodiment 1) of the present invention in a state that a resin sealing body is removed.
Figure 2:
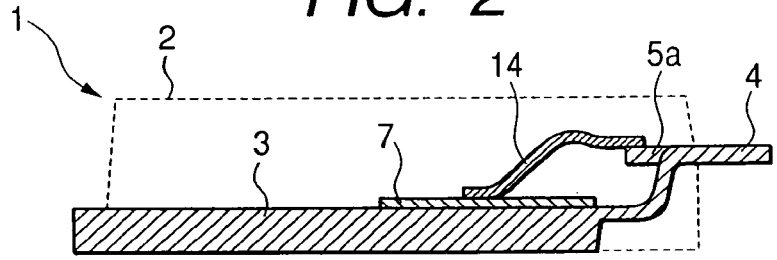
FIG. 2 is a cross-sectional view of the semiconductor device of the embodiment 1.
Figure 3:
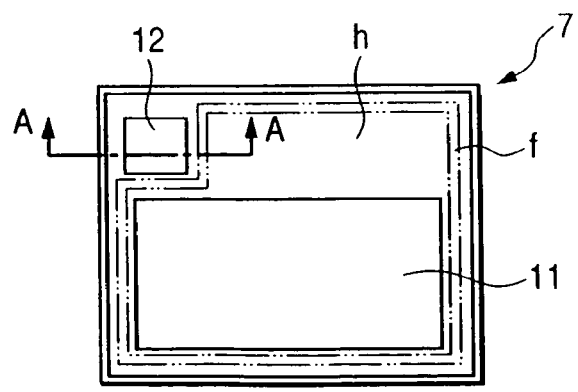
FIG. 3 is a schematic plan view of a semiconductor chip which is incorporated in the semiconductor device of the first embodiment.
Figure 4:
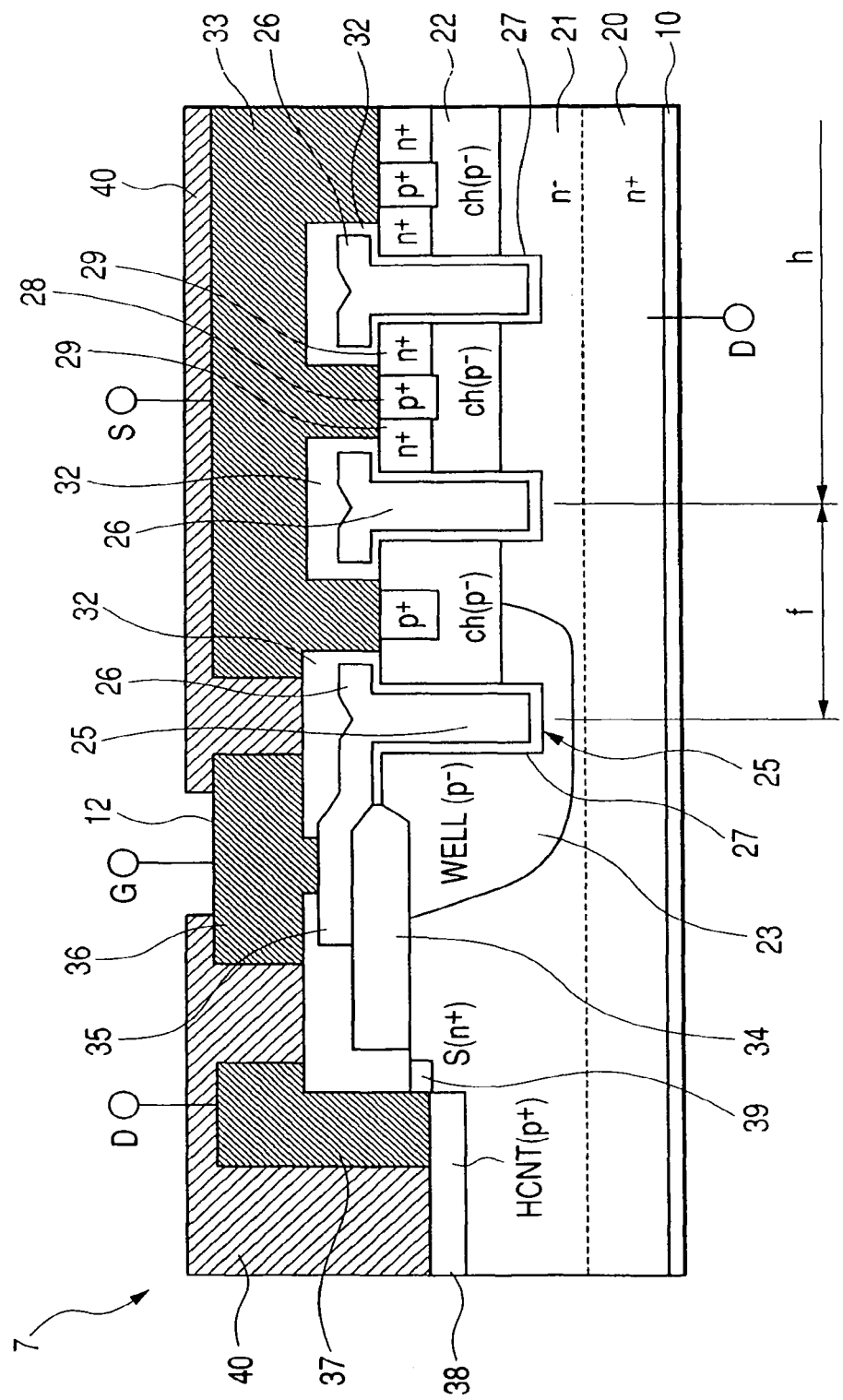
FIG. 4 is a cross-sectional view taken along a line A-A in FIG. 3.
Figure 5:
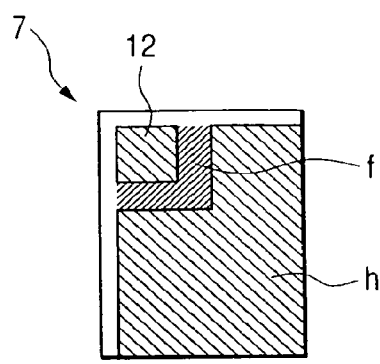
FIG. 5 is a plan view showing a portion of the chip in a state that a gate pad is arranged at a corner of the chip.
Figure 6:
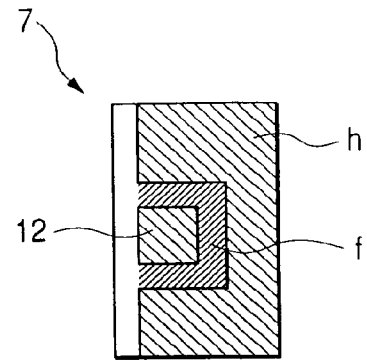
FIG. 6 is plan view of the portion of the chip in a state that a gate pad is arranged in the midst of a side of the chip.

FIG. 1 to FIG. 8 are views relating to a semiconductor device as one embodiment of the present invention (embodiment 1). FIG. 1 is a schematic plan view of the semiconductor device in a state that a resin sealing body is removed, FIG. 2 is a cross-sectional view of the semiconductor device, FIG. 3 is a schematic plan view of a semiconductor chip which is incorporated into the semiconductor device, FIG. 4 is a cross-sectional view taken along a line A-A in FIG. 3, FIG. 5 is a plan view showing a portion of a chip which shows a state in which a gate electrode pad is arranged at a corner of the chip and FIG. 6 is a plan view showing a portion of a chip which shows a state in which a gate electrode pad is arranged in the midst of a side of the chip.

In the embodiment 1, an example in which the present invention is applied to a vertical type power transistor (semiconductor device) 1 is explained. That is, a semiconductor chip which incorporates a field effect transistor is incorporated into the semiconductor device 1, wherein the field effect transistor includes a drain (D) electrode as a first electrode, a source (S) electrode as a second electrode and a gate (G) electrode as a control electrode.

The power transistor 1 comprises, as shown in FIG. 1 and FIG. 2, a sealing body 2 which is formed of insulating resin, a metal-made support board (header) 3 which has at least a portion thereof covered with the sealing body 2, has the lower surface thereof exposed from the sealing body 2 and constitutes the first electrode, a first electrode lead (drain lead) 4 which is formed contiguously with the support board 3, projects from one end surface of the sealing body 2 and is bent in one-stage step-like manner in the midst thereof, a second electrode lead (source lead) 5 and a control electrode lead (gate lead) 6 which project from the above-mentioned one end surface of the sealing body 2 in a state that these leads 5, 6 are arranged in parallel with the first electrode lead 4. The source lead 5 and the gate lead 6 have the same height as the drain lead 4. The support board 3 has a large thickness and the leads have a small thickness and these parts are formed of a deformed member having different thicknesses partially.

Further, a semiconductor chip 7 is arranged in the inside of the sealing body (package) 2. As shown in FIG. 4, the semiconductor chip 7 has the structure in which a vertical type power MOSFET is formed therein and a first electrode (drain electrode) 10 is formed on a lower surface thereof. As shown in FIG. 3 and FIG. 1, the semiconductor chip 7 includes a second electrode (source electrode) pad 11 and a control electrode (gate electrode) pad 12 on a main surface (upper surface) thereof. The drain electrode is made of Ti, Ni or Au. Further, the source electrode pad 11 and the gate electrode pad 12 are made of Al.

As shown in FIG. 2, a drain electrode not shown in the drawing which is formed on the lower surface the semiconductor chip 7 is fixed to the support board (header) 3 by way of a conductive adhesive material (not shown in the drawing). Further, the source lead 5 and the gate lead 6 have lead posts 5a, 6a at distal ends thereof which extend in the inside of the sealing body 2, wherein these lead posts 5a, 6a have large widths. These lead posts 5a, 6a are respectively connected with the source electrode pads 11 and the gate electrode pad 12 of the semiconductor chip 7 via wires 14, 15.

The wire 15 which connects the lead post 6a of the gate lead 6 with the gate electrode pad 12 is a fine Al line having a diameter of, for example, 125 µm. The lead post 5a of the source lead 5 and the source electrode pad 11 are connected with each other by a plurality of wires 14. Although two wires 14 are shown in the drawing, the number of the wires 14 may be increased to lower the ON resistance. The wires 14 have a diameter of about 300 to 500 µm. For example, the diameter of the wires 14 may be 500 µm which is greater than a diameter of the wire 15. The wire 15 is also formed of an Al line. Further, to lower the ON resistance, a connecting length of the wire 14 is set to 5 mm or less. Further, either wire is bonded by rubbing using ultrasonic waves. Accordingly, when wire bonding is applied to the electrode pad on the main surface of the semiconductor chip 7, it is necessary to perform the wire bonding in such a manner that a bonding tool which holds the wire is not brought into contact with a lead post which is arranged at a position one stage higher than the bonding tool.

In this embodiment 1, as shown in FIG. 1, the gate electrode pad 12 is arranged at a position far from the lead post, the source electrode pad 11 is large, and the wires 14 are bonded to the source electrode pad 11 at respective positions along the center line of the source electrode pad 11 and hence, there is no possibility that a bonding tool is brought into contact with the lead post whereby the reliable wire bonding can be realized.

Here, the semiconductor chip 7 is explained briefly. As shown in FIG. 3, the semiconductor chip 7 has a quadrangular shape as a plan view. The source electrode pad 11 has a large width (rectangular shape) and, at the same time, is mounted on the chip at a position offset to one side of the chip. A side of the semiconductor chip 7 which is arranged close to the source electrode pad 11 (a side which forms a lower edge in FIG. 3) constitutes a side which opposingly faces the lead posts when the semiconductor chip 7 is fixed to the support board 3. At one corner portion (the left-side corner in FIG. 3) of the chip which is formed contiguously with a side (a side which forms an upper edge in FIG. 3) of the semiconductor chip 7 opposite to the opposingly facing side, the gate electrode pad 12 is positioned. As shown in FIG. 1, the gate electrode pad 12 is offset from the center line of the source electrode pad 11 by a distance e.

The semiconductor chip 7 is, although a size thereof is not specifically limited, a length of one side is set to 8 to 9 mm. Further, since the wire 15 has a diameter of 125 µm, the gate electrode pad 12 has a square shape having one side of approximately 0.3 to 0.5 mm. On the other hand, for example, since a plurality of wires 14 are connected to the source electrode pad 11 along the center line of the source electrode pad 11, the size of the source electrode pad 11 is set such that a longitudinal size is 4 mm and a lateral size (width) is 7 mm, for example.

FIG. 4 is an enlarged cross-sectional view of a portion taken along a line A-A in FIG. 3. The semiconductor chip 7 is formed based on an $n^+$ type silicon semiconductor board 20 having $n^-$ type epitaxial layer 21 on a main surface thereof. The power transistor 1 is formed of a vertical MOSFET and a large number of cells (transistors) are arranged in rows in a plan view. In this embodiment, the respective transistor cells have the trench constitution. A $p^-$ type channel (ch) layer 22 is formed on a given region of the epitaxial layer 21 and, at the same time, a $p^-$ type well layer 23 which constitutes a guard ring is formed around an outer periphery of the $p^-$ type channel (ch) layer 22.

Further, a large number of trenches (grooves) 25 are formed in the cell forming region such that the trenches penetrate the channel (ch) layer 22. The trench 25 is also formed in the well layer 23. A region defined between the trench which is formed in the well layer 23 and the trench which constitutes the cell positioned at the outermost periphery in the inside of the trench formed in the well layer 23 constitutes an invalid region f which is not used as a cell. The invalid region f is a region which is sandwiched by two lines formed of a chain double-dashed line in FIG. 3. The region surrounded by the invalid region f constitutes a valid region h in which the cells are formed. The larger a width of the valid region h, the number of cells can be increased and an output of the power transistor 1 can be increased.

In this embodiment 1, the gate electrode pad 12 is provided at one corner of the semiconductor chip 7 and is positioned outside the region (valid region h) which is surrounded by the invalid region f. As shown in FIG. 6, it is possible to position the gate electrode pad 12 in the midst portion of a side of the chip which is contiguous with a side which opposingly faces the lead posts and also orthogonal to the opposingly facing side. To make the gate electrode pad 12 correspond to the lead post 6a of the gate lead 6, the gate electrode pad 12 is arranged in the midst of the left side of the chip.

When the gate electrode pad 12 is provided at the midst portion of one side of the chip, as shown in FIG. 6, the invalid region f appears along three sides of the gate electrode pad 12. On the other hand, when the gate electrode pad 12 is provided at the corner of the chip, as shown in FIG. 5, the invalid region f appears only along two sides of the gate electrode pad 12. Accordingly, by providing the gate electrode pad 12 at the corner, it is possible to reduce an area of the invalid region f. Since an area of the valid region h can be increased corresponding to a reduced amount of the invalid area f, it is possible to increase the number of cells. In this embodiment, for example, the cell has a square shape having each side of 3 to 5 μm. Since one side of the gate electrode pad 12 is 300 to 500 μm, by forming the gate electrode pad 12 at the corner, it is possible to form a larger number of cells.

A polysilicon gate layer 26 which constitutes a gate electrode is formed in the inside of the trench 25 and a gate insulation film 27 is formed below the polysilicon gate layer 26. Further, a $p^+$ region 28 is formed on a center surface layer portion of the channel layer 22 which is surrounded by the trench. With respect to the channel layer 22 in the cell portion, an $n^+$ type source region 29 is formed in a region ranging from the outside of the $p^+$ region 28 to the trench. The trench portion, that is, the gate insulation film 27 and the polysilicon gate layer 26 are covered with an insulation film 32 and the source electrode 33 is formed over the insulation film 32. The source electrode 33 is electrically connected with the $p^+$ region 28 and the source region 29 at opening portions where the insulation film 32 is not formed.

At the trench 25 portion which is positioned outside the invalid region f, a thick insulation film (LOCUS) 34 is formed contiguously with the gate insulation film 27. The thick insulation film (LOCUS) 34 extends beyond the outer periphery of the well layer 23. The polysilicon gate layer 26 which is embedded in the trench 25 positioned outside the invalid region f extends over the midst portion above the thick insulation film 34 and forms a peripheral gate line 35. Further, the peripheral gate line 35 and the thick insulation film 34 are also covered with the insulation film 32. Over the insulation film 32 portion, a gate electrode line 36 is formed. The gate electrode line 36 is electrically connected with the polysilicon gate layer 26 through an opening partially formed in the insulation film 32.

As shown in FIG. 4, the insulation film 32 assumes a state in which the insulation film 32 does not reach the periphery of the semiconductor chip 7. Further, a surface of the epitaxial layer 21 which is arranged away from the insulation film 32 is slightly etched and hence is lowered by one stage. Over this lowered portion, the periphery of the insulation film 32 is covered with the guard ring 37 which assumes the same potential as the drain electrode. Over a surface layer of the epitaxial layer 21 below the guard ring 37, a $p^+$ type guard ring contact layer (HCNT) 38 is formed. The guard ring contact layer (HCNT) 38 extends to an edge of the semiconductor chip 7. Further, over a surface layer portion of the epitaxial layer 21 inside the guard ring 37, a $n^+$ type channel stopper layer (S) 39 is formed. Since the guard ring contact layer (HCNT) 38 assumes the potential of the guard ring 37, the channel stopper layer (S) 39 has an advantageous effect that the layer 39 guards the progress of a deplete layer.

The main surface of the semiconductor chip 7 is, as shown in FIG. 4, covered with and protected by an insulation film 40. Further, openings are selectively formed in the insulation film 40. The opening portions constitute the source electrode pad 11 and the gate electrode pad 12 shown in FIG. 3 and FIG. 1.

On the other hand, in the center portion of the sealing body 2 which is arranged away from the semiconductor chip 7, a mounting hole 8 which is used at the time of mounting the power transistor 1 on the mounting board or the like is formed. In the support board 3 which supports the sealing body 2 in which the mounting hole 8 is formed, a hole 9 which is concentric with the mounting hole 8 and is larger than the mounting hole 8 is formed. Further, on the main surface of the support board 3, a V-shaped groove is formed in a quadrangular frame form. The resin which forms the sealing body 2 is also filled in the inside of the V groove of the V groove frame 41. Due to the provision of the V groove frame 41, it is possible to make the intrusion of moisture into an interface between the support board 3 and the sealing body 2 difficult. Further, press-deformable portions 42 are provide over two positions at both sides of the support board 3 and the resin which forms the sealing body 2 is positioned above and below the press-deformable portions 42 thus making peeling-off of the sealed body 2 from the support board 3 difficult. Due to such a constitution, the moisture resistance of the power transistor 1 is enhanced.

Figure 7:
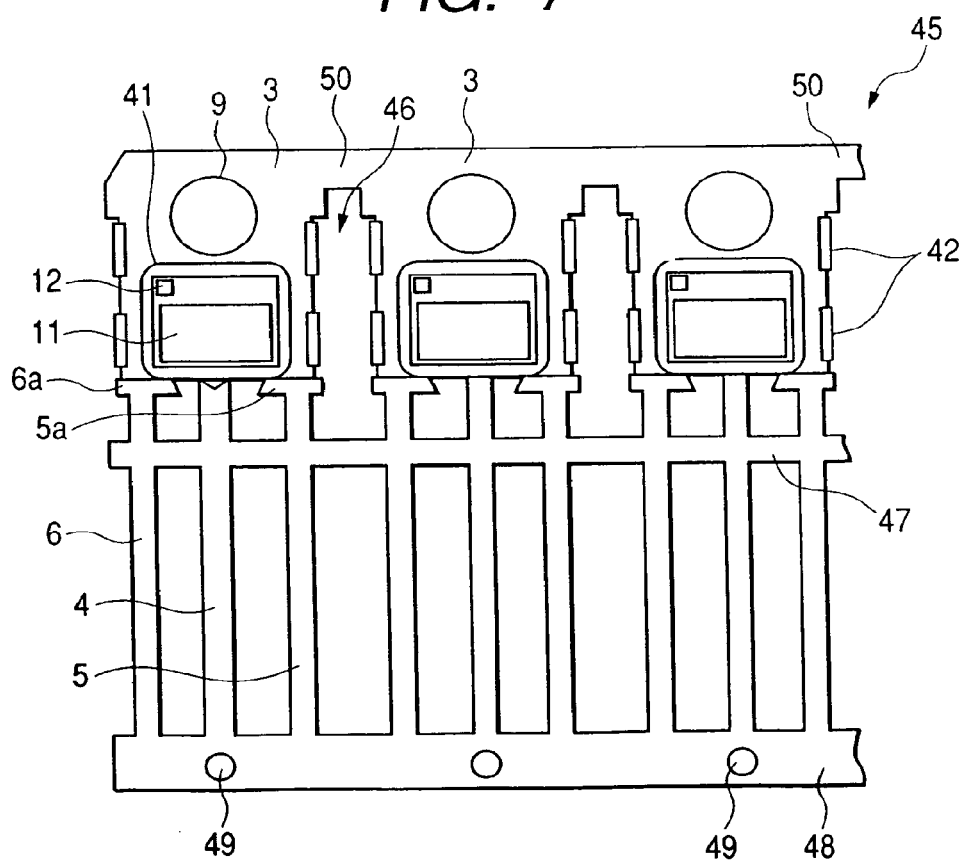
FIG. 7 is a plan view showing a lead frame to which a chip is fixed in the manufacture of the semiconductor device of the embodiment 1.
Figure 8:
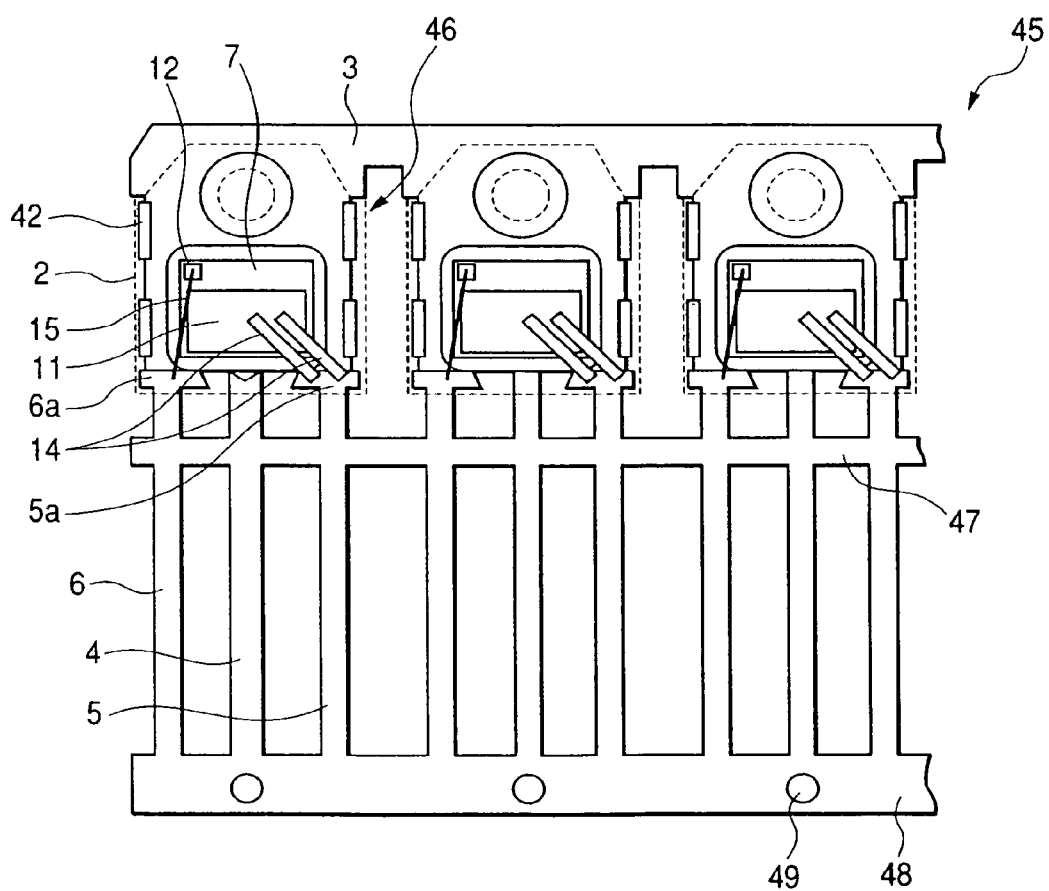
FIG. 8 is a plan view showing a lead frame to which wires are connected in the manufacture of the semiconductor device of the embodiment 1.

Next, the manufacturing method of the semiconductor device (power transistor 1) of this embodiment 1 is explained in conjunction with FIG. 7 and FIG. 8. FIG. 7 is a plan view showing a lead frame to which a chip is fixed in the manufacture of the power transistor of the embodiment 1 and FIG. 8 is a plan view showing a lead frame to which wires are connected.

In the manufacture of the power transistor 1, the lead frame 45 is prepared as shown in FIG. 7. To manufacture a plurality of power transistors 1, the lead frame 45 is configured such that a plurality of unit frames 46 each of which is served for manufacturing one power transistor 1 are connected in a strip form in parallel.

The unit lead frame 46 has a pattern in which three leads 6, 4, 5 explained in conjunction with FIG. 1 extend a given length. The unit lead frame 46 also includes a narrow dam 47 which extends in the direction orthogonal to these three leads 6, 4, 5 to hold these leads and a frame piece 48 which connects distal end portions of three leads 6, 4, 5. The dam 47 is provided at a position close to the sealing body 2.

The unit lead frames 46 are connected with each other by these dams 47 and the frame piece 48. Further, the manufacturing method also adopts the structure in which a distal-end-side portion of the support board (header) 3 is also connected with the neighboring header by the connecting portion 50. FIG. 7 shows a state in which three unit lead frames 46 are arranged in parallel to each other. Further, the support board 3 is lowered by one stage than the respective leads (see FIG. 2). Guide holes 49 are formed in the frame piece 48. The guide holes 49 are used for transporting the lead frame 45 and for positioning the lead frame 45. The lead frame 45 is formed into a pattern by blanking a strip-like metal plate (profile) made of copper alloy or the like which increases a thickness thereof with a given width at one side thereof using a precision press and, at the same time, by raising a thin portion one stage higher than a thick portion by bending the thin portion (the step difference being 1.8 mm). The thick portion constitutes the above-mentioned support board 3 and has a thickness of 1.26 mm and the thin portion constitutes the above-mentioned gate leads 6, the drain lead 4 and the source leads 5 and has a thickness of 0.6 mm. Distal ends of the source leads 5 and the gate leads 6 form the lead posts 5a, 6a having large widths.

The semiconductor chips 7 are fixed to respective support boards 3 of the lead frame 45 having such a constitution at given positions by way of an adhesive material. Here, the semiconductor chip 7 is fixed in a state that the source electrode pad 11 is positioned at the position close to the lead posts 5a, 6a and the gate electrode pad 12 is positioned at the position far from the lead posts 5a, 6a (see FIG. 7).

Next, as shown in FIG. 8, the source electrode pad 11 and the lead posts 5a of the source lead 5 are electrically connected with each other using the Al wires having a diameter of 500 μm. The source electrode pad 11 and the source lead 5 are connected with each other using two wires 14. The wires 14 are connected by ultrasonic wave wire bonding.

Next, the gate electrode pad 12 and the lead post 6a of the gate lead 6 are connected with each other using the Al wire 15 having a diameter of 125 μm. The wire 15 is connected by ultrasonic wave wire bonding. Even when the distal end of the wire 15 is connected to the gate electrode pad 12 by ultrasonic wave wire bonding, since the gate electrode pad 12 is arranged at the position far from the lead post 6a, there is no possibility that the bonding tool is brought into contact with the lead post 6a and hence, the reliable wire bonding can be performed. Accordingly, it is possible to fix the semiconductor chip 7 to the support board 3 such that semiconductor chip 7 is arranged close to the lead posts 5a, 6a. Due to such provision, it is possible to shorten the length of the support board 3 and to increase the size of the semiconductor chip 7 to be fixed and hence, the miniaturization of the power transistor 1 and the increase of the output due to the large-sizing of the chip can be realized.

Next, as indicated by a dotted line in FIG. 8, the sealing body 2 is formed by a transfer molding method or the like using insulating resin. Subsequently, the dam 47 between respective leads and the connecting portion 50 are removed by cutting and, thereafter, respective leads are cut whereby a plurality of power transistors 1 shown in FIG. 1 and FIG. 2 are manufactured.

Next, when necessary, solder plating treatment is applied to surfaces of the leads projecting from the sealing body 2 so as to form mounting solder plating films not shown in the drawing on given positions of the leads and the support board 3.

The power transistor 1 of this embodiment 1 can be, for example, used as a switch of a control system of an automobile, for example. For example, the power transistor has the output of 10 to 15 W (power source voltage: 10 to 20V).

According to this embodiment 1, following advantageous effects can be obtained.

(1) Since the gate electrode pad 12 is arranged at the position far from the lead post 6a of the gate lead 6, at the time of performing the wire bonding, there is no possibility that the bonding tool which holds the wire is brought into contact with the lead post 6a of the gate lead 6. As a result, it is possible to arrange the semiconductor chip 7 to be fixed to the support board (header) 3 at the position close to the lead post 6a side of the gate lead 6 and hence, the support board 3 can be made small correspondingly whereby the miniaturization of the power transistor (semiconductor device) can be realized.

(2) Due to the above-mentioned advantageous effect, it is possible to arrange the semiconductor chip 7 to be fixed to the support board 3 close to the lead post 6a side of the gate lead 6 and hence, it is possible to fix the semiconductor chip 7 having the larger size to the support board 3. As a result, it is possible to increase the output of the power transistor 1.

(3) Since the source electrode pad 11 can be arranged close to the source lead 5, a length of the wire 14 which connects the source electrode pad 11 and the source lead 5 can be shortened whereby the ON resistance can be reduced.

Embodiment 2

Figure 9:
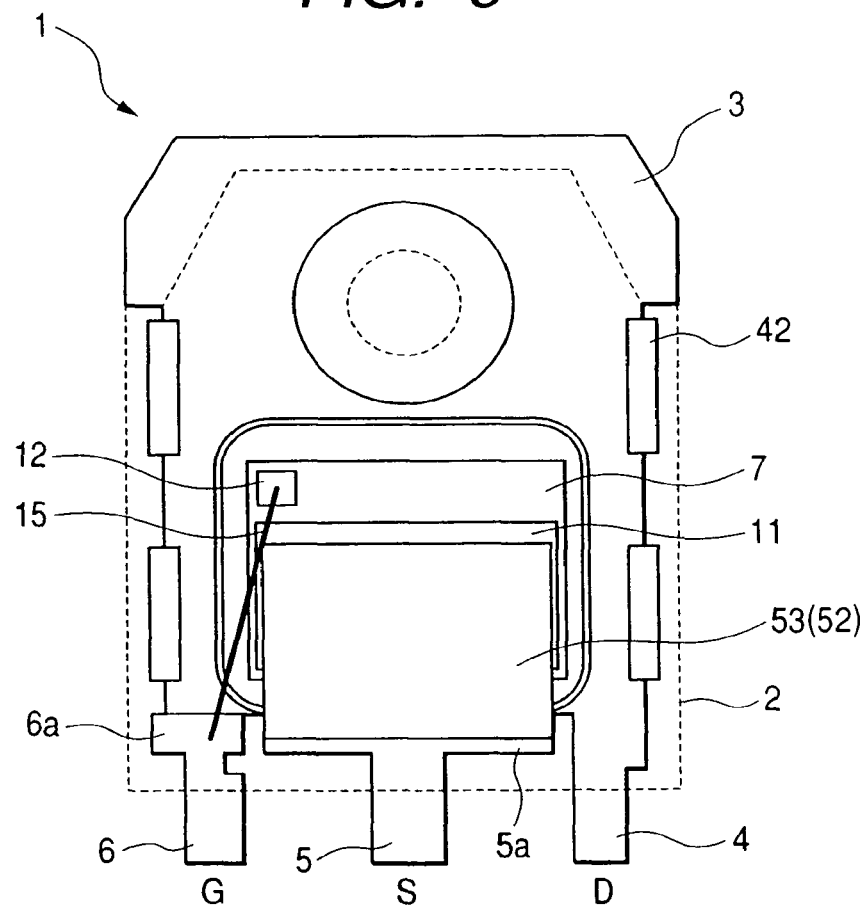
FIG. 9 is a schematic plan view of a semiconductor device according to another embodiment (embodiment 2) of the present invention in a state that a resin sealing body is removed.
Figure 10:
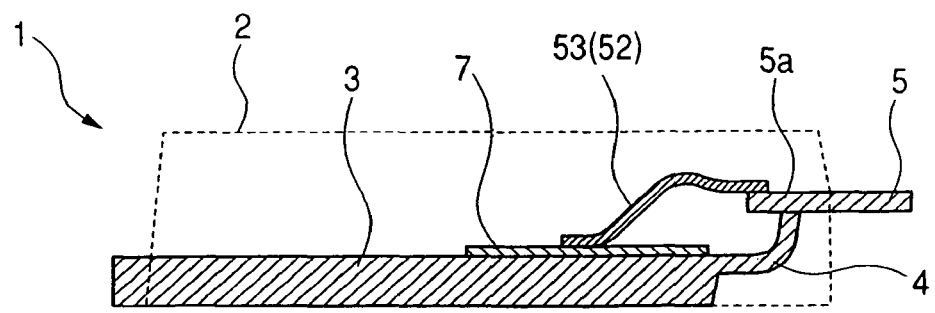
FIG. 10 is a cross-sectional view of the semiconductor device of the embodiment 2.

FIG. 9 is a schematic plan view of a semiconductor device according to another embodiment (embodiment 2) of the present invention in a state that a resin sealing body is removed, and FIG. 10 is a cross-sectional view of the semiconductor device.

This embodiment 2 is characterized in that, in a power transistor 1 of the embodiment 1, a source electrode pad 11 and a source lead 5 are connected with each other using a conductive plate 52. In this embodiment, as the conductive plate 52, a ribbon strap 53 formed of a resilient Al foil having a thickness of approximately 150 to 250 μm is used.

In this embodiment, for facilitating the connection using the conductive plate 52, as shown in FIG. 9, the source lead 5 is arranged at the center, the gate lead 6 is arranged at the left side of the source lead 5 and the drain lead 4 is arranged at the right side of the source lead 5. The lead post 5a of the source lead 5 has a width larger than widths of other leads so as to enable the connection of the conductive plate 52. For example, the lead post 5a has the substantially same width as the source electrode pad 11. Accordingly, a ribbon strap having a large width can be connected to the lead post 5a. The ribbon strap 53 is formed of a resilient Al foil and is connected with the source electrode pad 11 and the lead post 5a of the source lead 5 by ultrasonic wave bonding.

That is, in the manufacture of the power transistor 1, first of all, a lead frame 45 shown in FIG. 7 is prepared. The lead frame 45 is formed of a sheet of metal plate which is patterned and is bent by one stage at one portion thereof. The lead frame 45 includes a support board which constitutes a first electrode (drain electrode) and to which a semiconductor chip is fixed, a first electrode lead (drain lead 4) which supports the support board at a distal end thereof, and a second electrode lead (source lead 5) and a control electrode lead (gate lead 6) which extend in parallel with the first electrode lead.

Further, a quadrangular semiconductor chip 7 having the first electrode (drain electrode) on a lower surface thereof and a second electrode pad (source electrode pad 11) and a control electrode pad (gate electrode pad 12) on an upper surface thereof is prepared.

Next, the semiconductor chip 7 is fixed to the support board 3 by way of a conductive bonding material at the first electrode portion (drain electrode) thereof.

Next, the source electrode pad 11 of the semiconductor chip 7 and the source electrode pad 11 are electrically connected with each other using connecting means and, at the same time, the gate electrode pad 12 of the semiconductor chip 7 and the gate lead 6 are electrically connected with each other using connecting means. Although the gate electrode pad 12 and the gate lead 6 are connected with each other by an Al wire 15 having a diameter of 125 µm, the source electrode pad 11 and the source electrode pad 11 are connected with each other by the above-mentioned ribbon strap 53. In this case, as shown in FIG. 9, the wire 15 traverses a corner portion of the ribbon strap 53 and hence, it is necessary to connect the gate electrode pad 12 and the lead post 6a of the gate lead 6 by the wire 15 after the connection of the ribbon strap 53 is finished.

Next, the semiconductor chip 7, the wire 15 and the ribbon strap 53 which constitute connecting means, and portions of the source lead 5 and the gate lead 6 are covered with a sealing body 2 by sealing them using insulating resin.

Next, in the same manner as the embodiment 1, unnecessary portions of the lead frame 45 are cut and removed and, at the same time, the leads are cut by a given length.

According to this embodiment, by using the ribbon strap 53 having a large width, further lowering of the ON resistance can be obtained. The power transistor 1 according to this embodiment 2 also can obtain advantageous effects substantially equal to the advantageous effects obtained by the power transistor 1 of the embodiment 1.

Embodiment 3

Figure 11:
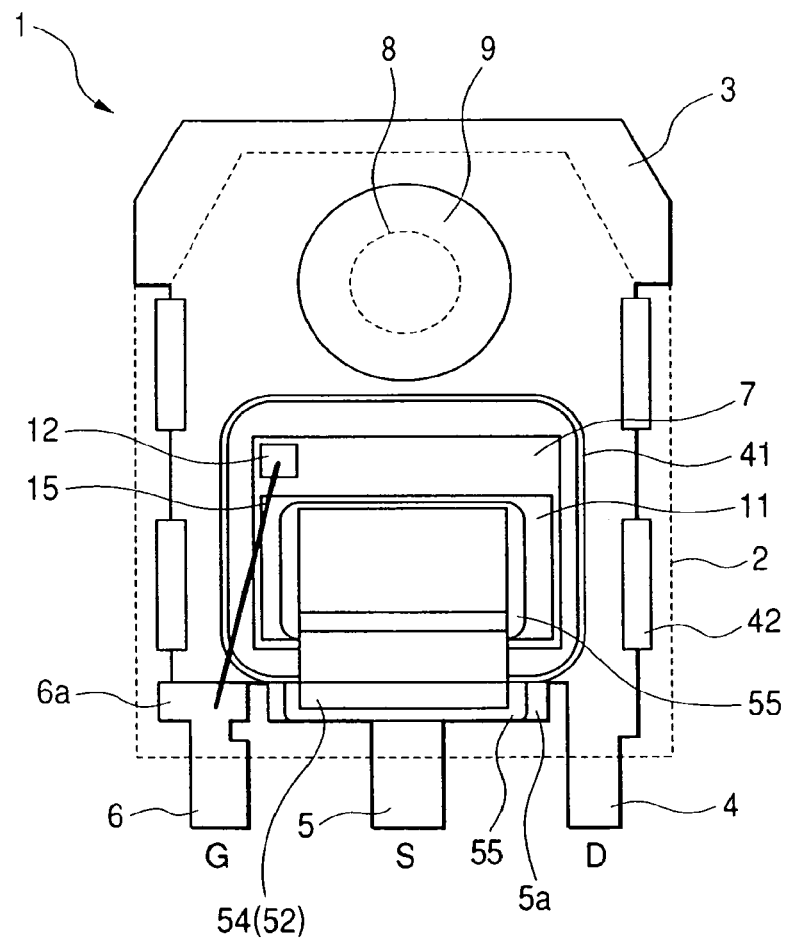
FIG. 11 is a schematic plan view of a semiconductor device according to another embodiment (embodiment 3) of the present invention in a state that a resin sealing body is removed.
Figure 12:
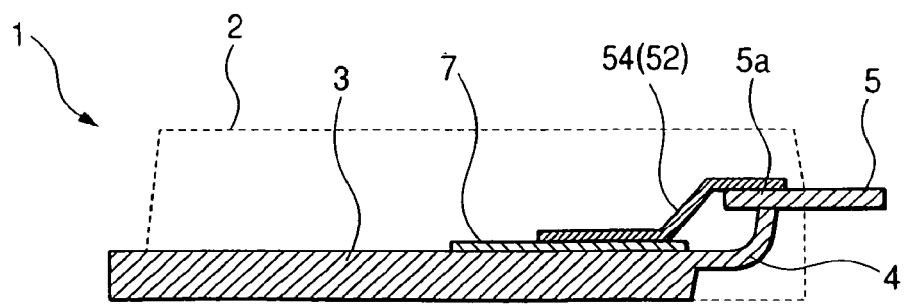
FIG. 12 is a cross-sectional view of the semiconductor device of the embodiment 3.

FIG. 11 is a schematic plan view of a semiconductor device according to another embodiment (embodiment 3) of the present invention in a state that a resin sealing body is removed and FIG. 12 is a cross-sectional view of the semiconductor device.

In this embodiment, the source electrode pad 11 and the source lead 5 are connected with each other by the conductive plate 52 in the same manner as the embodiment 2. However, in this embodiment, as the conductive plate 52, a metal plate 54 molded in a given shape is used. The metal plate 54 is formed of a copper plate, for example. As shown in FIG. 11, the molded metal plate 54 is electrically connected to a source electrode pad 11 and a lead post 5a of a source lead 5 using an adhesive material 55. As the adhesive material, a conductive resin, solder or the like is used. However, in this case, it is necessary to perform the under barrier metal forming on the surface of the source electrode pad 11. This operation is necessary to prevent an Al surface oxide film from impeding conductivity. The under barrier metal layer is constituted such that, for example, a Ni layer is formed on an Al pad surface and the uppermost portion thereof is formed of Au or Ag which prevents the oxidation of Ni.

Also in this embodiment 3, lowering of the ON resistance can be obtained. Further, since the metal plate 54 is connected using the adhesive material 55, the operation is facilitated. The power transistor 1 according to this embodiment 3 also can obtain the similar advantageous effect as the power transistor 1 of the embodiment 2.

Embodiment 4

Figure 13:
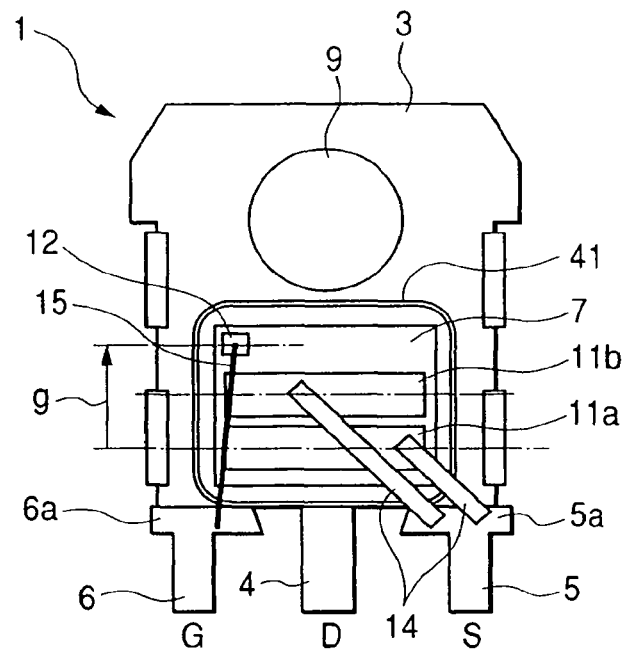
FIG. 13 is a schematic plan view of a semiconductor device according to another embodiment (embodiment 4) of the present invention in a state that a resin sealing body is removed.

FIG. 13 is a schematic plan view of a semiconductor device according to another embodiment (embodiment 4) of the present invention in a state that a resin sealing body is removed.

In this embodiment 4, the source electrode pad 11 in the power transistor 1 of the embodiment 1 is constituted of two source electrode pads 11a, 11b and the respective source electrode pads 11a, 11b and the lead post 5a of the source lead 5 are connected with each other by wires 14 respectively. This embodiment also adopts the structure that the longer the distance g from the center line of the source electrode pad 11a close to the lead post 5a, 6a, the gate electrode pad 12 is arranged at a position farther from the lead post 5a, 6a. In FIG. 13, a sealing body 2 is omitted.

Also according to the power transistor 1 of this embodiment 4, in the same manner as the embodiment 1, the gate electrode pad 12 is arranged at a position far from the lead post 6a of the gate lead 6 and hence, the wire bonding is not hampered. Further, the center line portion of the source electrode pad 11a is arranged approximately 2 mm, for example, from aside of the semiconductor chip 7 close to the lead post 5a of the source lead 5 and, at the same time, the wire 14 is connected as a first bonding at this portion. Accordingly, it is possible to perform the favorable wire bonding without bringing the bonding tool into contact with the lead post 5a. In this manner, provided that the gate electrode pad 12 is arranged at the position which does not hamper the wire bonding, there arises no problem even when the number of the source electrode pads 11 is increased to 3 or 4.

In the constitution of this embodiment 4, since a plurality of source electrode pads 11 are provided, the portions where the wires are connected is increased whereby the wire bonding using the larger number of wires can be performed and hence, the ON resistance can be lowered. The power transistor 1 according to this embodiment 4 can also obtain the similar advantageous effect as the power transistor 1 according to the embodiment 1.

Embodiment 5

Figure 14:
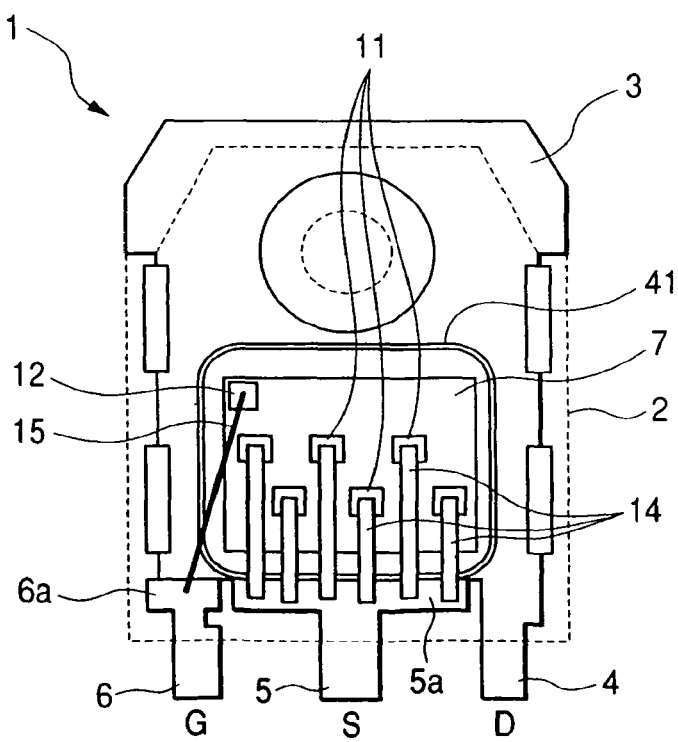
FIG. 14 is a schematic plan view of a semiconductor device according to another embodiment (embodiment 5) of the present invention in a state that a resin sealing body is removed.
Figure 15:
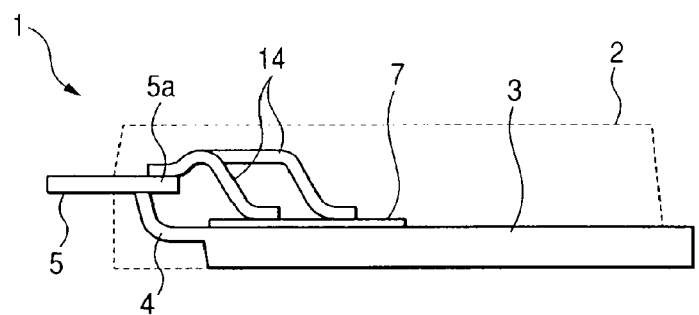
FIG. 15 is a cross-sectional view of the semiconductor device of the embodiment 5.
Figure 16:
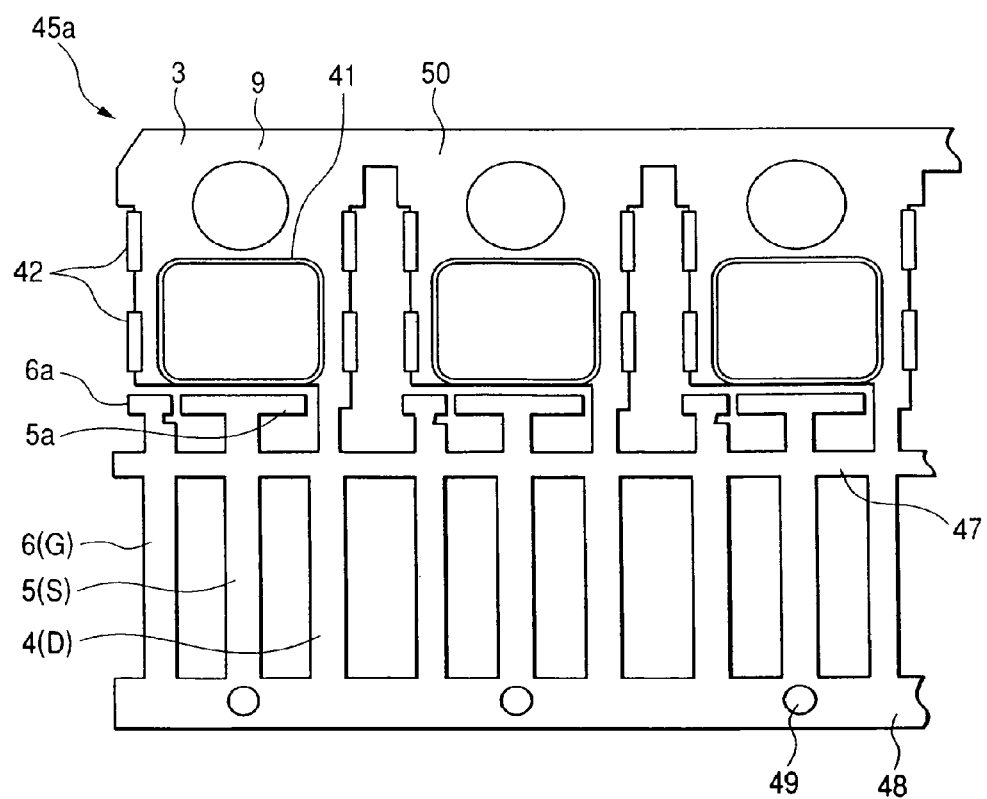
FIG. 16 is a plan view of a lead frame which is used in the manufacture of the semiconductor device of the embodiment 5.

FIG. 14 is a schematic plan view of a semiconductor device according to another embodiment (embodiment 5) of the present invention in a state that a resin sealing body is removed, FIG. 15 is a cross-sectional view of the semiconductor device and FIG. 16 is a plan view of a lead frame used in the manufacture of the semiconductor device.

This embodiment 5 is, in the same manner as the embodiment 4, also based on the technical concept that a plurality of source electrode pads 11 are provided and the respective source electrode pads 11 and the source lead 5 are electrically connected with each other using connecting means such as wires or the like.

In this embodiment 5, as shown in FIG. 14, the source electrode pads 11 are formed in a quadrangular shape having the same size as a gate electrode pad 12 and are formed in a plural number in a staggered pattern in the direction which intersects the extending directions (width direction of the support board 3) of the respective leads. Here, to perform the wire bonding effectively, the source lead 5 is arranged at the center.

FIG. 16 shows a lead frame 45a which is used in the manufacture of the power transistor 1 of this embodiment 5. This lead frame 45a differs from the lead frame 45 of the embodiment 1 in the arrangement of the leads. The lead frame 45a of this embodiment also differs from the lead frame 45 of the embodiment 1 with respect to other points including a point that the width (length) of the lead post 5a of the source lead 5 is larger than the width (length) of other lead, that is, of the gate lead 6.

That is, in the power transistor 1 of this embodiment 1, as shown in FIG. 14, the source lead 5 is arranged in the center thereof, the gate lead 6 is arranged at one side (left side) of the source lead 5, and the drain lead 4 is arranged at the other side (right side) of the source lead 5. Then, the width of the source lead 5, that is, the width of the lead post 5a of the source lead 5 is set larger than the width of the other lead (width of the lead post 6a of the gate lead 6). That is, the width (length) of the lead post 5a is set wide enough to enable the connection of the lead post 5a with all of the wires 14 which are connected to the respective source electrode pads 11 which are arranged in a staggered pattern. Further, also as shown in FIG. 15, the respective source electrode pads 11 and the lead post 5a of the source lead 5 are connected with each other by the wires 14.

Also in this embodiment 5, the gate electrode pad 12 is arranged at a position farther than the source electrode pad 11 arranged in a staggered pattern and hence, the bonding tool is not brought into contact with the lead post 5a when the wire bonding to the gate electrode pad 12 is performed. Also with respect to the source electrode pads 11 arranged in a staggered pattern, the source electrode pads 11 are arranged far enough from the lead post 5a of the source lead 5 and hence, at the time of applying the wire bonding to the source electrode pads 11, it is possible to perform the reliable wire bonding while preventing the bonding tool from being brought into contact with the lead post 5a of the source lead 5, Also in the power transistor 1 of this embodiment 5, the source electrode pad 11 and the source lead 5 can be connected with each other by a large number of the wire 14, that is, six wires and hence, the ON resistance can be reduced. The power transistor 1 of this embodiment 5 also can obtain the similar advantageous effect as the power transistor 1 of the embodiment 4.

Embodiment 6

Figure 17:
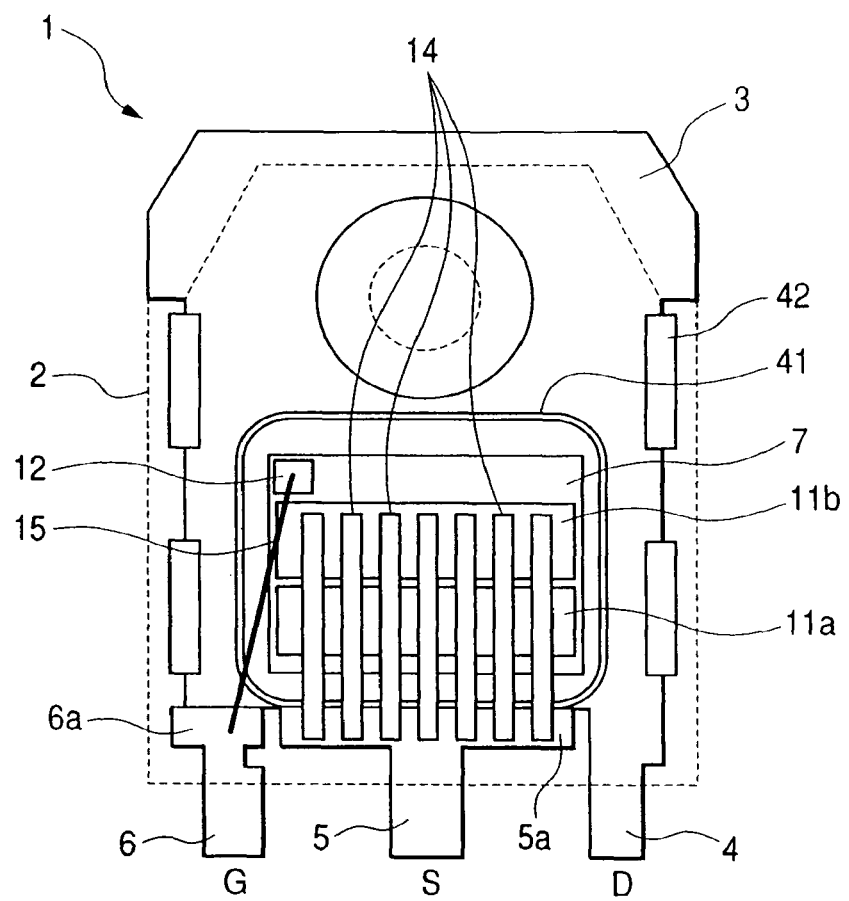
FIG. 17 is a schematic plan view of a semiconductor device according to another embodiment (embodiment 6) of the present invention in a state that a resin sealing body is removed.
Figure 18:
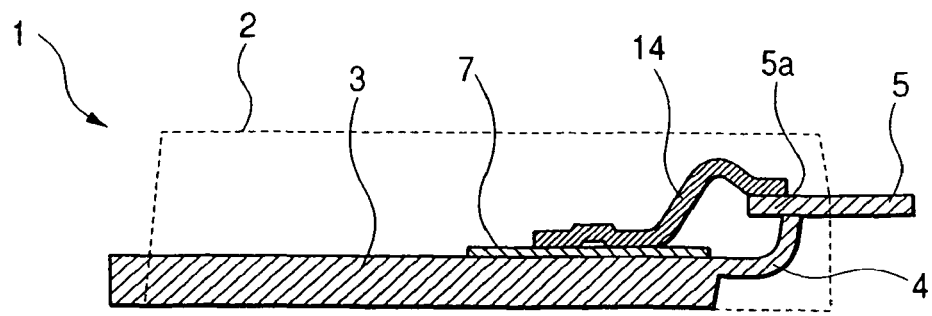
FIG. 18 is a cross-sectional view of the semiconductor device of the embodiment 6.

FIG. 17 is a schematic plan view of a semiconductor device according to another embodiment (embodiment 6) of the present invention in a state that a resin sealing body is removed and FIG. 18 is a cross-sectional view of the semiconductor device.

This embodiment 6 is the modification of the embodiment 5. Although the source electrode pads 11 are arranged in a staggered manner, in the embodiment 5, the source electrode pads 11 are not arranged in a staggered manner. That is, in the same manner as the embodiment 4, the source electrode pad 11 is formed of two long source electrode pads 11a, 11b which extend in parallel. Further, out of a plurality of wires 14, respective wires are, as shown in FIG. 18, connected to the source electrode pads 11a, 11b and the lead post 5a of the source lead 5.

With respect to the wire bonding according to this embodiment 6, the distal end of the wire held by the bonding tool is connected to the source electrode pad 11a which is arranged far from the lead post 5a of the semiconductor chip 7 as a first bonding point. Thereafter, the wire is pulled around using the bonding tool and the midst portion of the wire is connected to the source electrode pad 11b of the semiconductor chip. Then, the wire is connected to the lead post 5a of the source lead 5. Thereafter, the wire is cut at a portion thereof in the neighborhood of the connecting portion with the lead post 5a thus completing the one-stretch wire bonding. That is, in this embodiment 6, the connection of the wire 14 is performed by stitch bonding. By this stitch bonding, the source electrode pads 11a, 11b and the lead post 5a of the source lead 5 are connected with each other with a plurality of wires 14. FIG. 17 shows an example which uses 7 pieces of the wires 14.

Also in this embodiment 6, with respect to a plurality of wires 14 which connect the source electrode pads 11a, 11b and the source lead 5, at the time of performing the wire bonding of the wire 14 which is arranged at a side closer to the wire 15 for connecting the gate electrode pad 12 and the gate lead 6, there exists a possibility that a short-circuit defect arises because of contacting of the wire 14 with the wire 15. Accordingly, it is necessary to perform the wire bonding of the gate electrode pad 12 and the gate lead 6 after the wire bonding of the source electrode pads 11a, 11b and the source lead 5 is finished.

Also in this embodiment 6, the gate electrode pad 12 is arranged at a position farther than the source electrode pads 11a, 11b and hence, at the time of applying the wire bonding to the gate electrode pad 12, it is possible to prevent the bonding tool from being brought into contact with the lead post 5a. Further, with respect to the wire bonding of the source electrode pads 11a, 11b and the source lead 5, the source lead 5 is arranged at the center and the lead post 5a of the source lead 5 and the source electrode pads 11a, 11b face each other in an opposing manner while having the same width, favorable wire bonding can be performed without bringing the wire bonding into contact with the other lead post or the like. As a result, a large semiconductor chip 7 can be fixed to a support board 3.

Also in the power transistor 1 of this embodiment 6, since the source electrode pads 11 and the source lead 5 are connected with each other using a large number of wires 14, that is, seven wires, lowering of the ON resistance can be realized. The power transistor 1 of this embodiment 6 also obtains the similar advantageous effect as the power transistor 1 of the embodiment 5.

Embodiment 7

Figure 19:
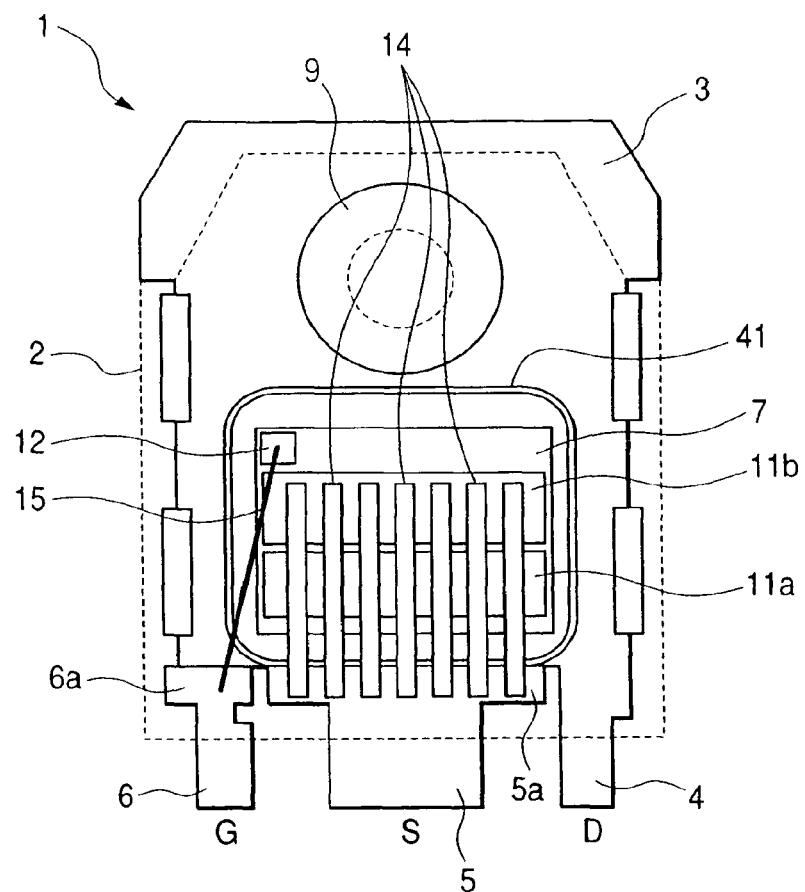
FIG. 19 is a schematic plan view of a semiconductor device according to another embodiment (embodiment 7) of the present invention in a state that a resin sealing body is removed.
Figure 20:
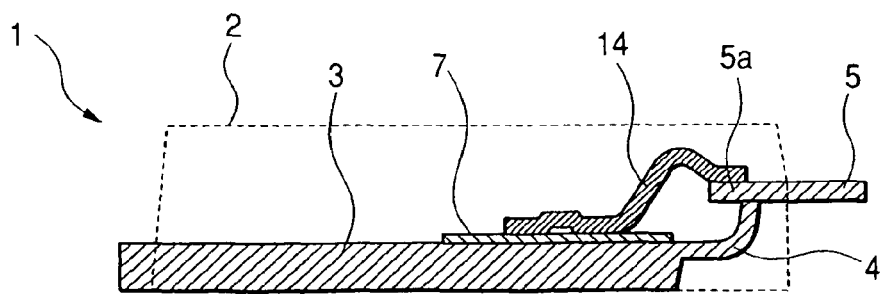
FIG. 20 is a cross-sectional view of the semiconductor device of the embodiment 7.

FIG. 19 is a schematic plan view of a semiconductor device according to another embodiment (embodiment 7) of the present invention in a state that a resin sealing body is removed and FIG. 20 is a cross-sectional view of the semiconductor device.

This embodiment 7 is the modification of the embodiment 6. That is, the source lead 5 which is arranged in the center thereof in the embodiment 6 is broadened or enlarged. Although the lead post 5a of the source lead 5 has naturally a large width to allow the connection of a plurality of wires 14 thereto, the lead post 5a is configured such that whole of the lead post 5a is broadened than the other leads (drain lead 4, gate lead 6) to cover even portions of the sealing body 2 which are outside the lead post 5a and are projected outwardly from a sealing body 2. Accordingly, it is possible to radiate heat which is generated in the semiconductor chip 7 in the inside of the sealing body 2 to the outside from the broad source lead 5 via a plurality of wires 14 and hence, the stable operation of the power transistor 1 can be realized. The power transistor 1 of this embodiment 7 can also obtain the similar advantageous effect as the power transistor 1 of the embodiment 6.

Embodiment 8

Figure 21:
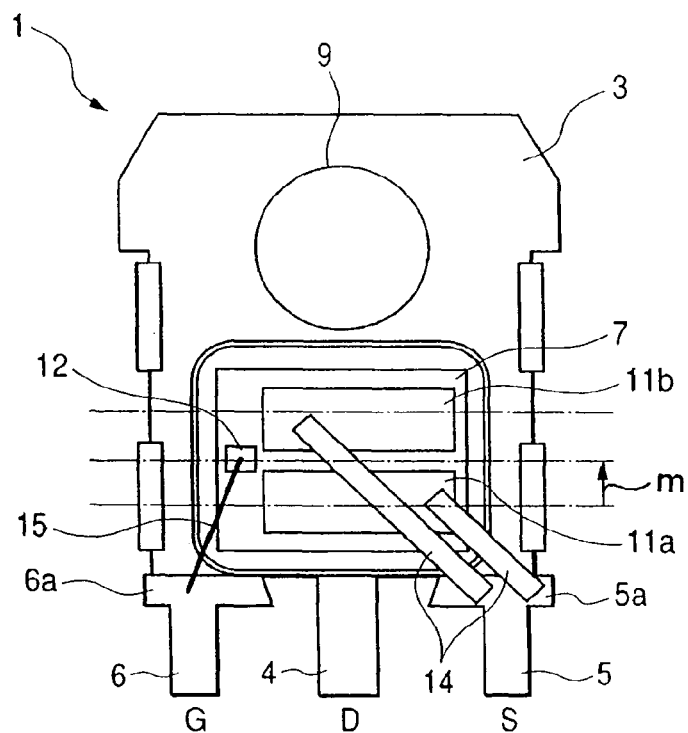
FIG. 21 is a schematic plan view of a semiconductor device according to another embodiment (embodiment 8) of the present invention in a state that a resin sealing body is removed.

FIG. 21 is a schematic plan view of a semiconductor device according to another embodiment (embodiment 8) of the present invention in a state that a resin sealing body is removed.

This embodiment 8 is also based on the technical concept that, in the same manner as the embodiment 1, with respect to the lead posts of the control electrode lead (gate lead) and the second electrode lead (source lead), the second electrode pad (source electrode pad) is arranged at the position close to the lead posts and the control electrode pad (gate electrode pad) is arranged at the position far from the lead posts.

The embodiment 8 also adopts the technical concept that when a plurality of second electrode pads are further provided, among these second electrode pads, the second electrode pad which is arranged close to the lead post is arranged at a position closer to the lead post than the control electrode pad.

A power transistor 1 of this embodiment 8 is the modification of the power transistor 1 of the embodiment 4. That is, the gate electrode pad 12 is arranged in the midst portion of the left side of the semiconductor chip 7 having a quadrangular shape. Since the gate electrode pad 12 is provided to the midst portion of the side, the source electrode pads 11*a*, 11*b* which are arranged in parallel can be shortened correspondingly.

In other words, one side of the semiconductor chip 7 having a quadrangular shape opposingly faces the lead posts 5*a*, 6*a* formed on distal ends of the gate lead 6 and the source lead 5. Then, the gate electrode pad 12 is arranged at the midst portion of the left side which is formed contiguously with the opposingly facing side and is arranged orthogonal to the opposingly facing side. As shown in FIG. 21, the gate electrode pad 12 is arranged at a position remote by a distance m from the center line of the source electrode pad 11*a* arranged close to the lead posts 5*a*, 6*a*. However, in this embodiment, compared to the source electrode pad 11*b* which is arranged far from the lead posts 5*a*, 6*a*, the gate electrode pad 12 is arranged close to the lead posts 5*a*, 6*a*. Accordingly, the power transistor 1 of this embodiment 8 also can obtain the similar advantageous effect as the power transistor 1 of the embodiment 1.

Embodiment 9

Figure 22:
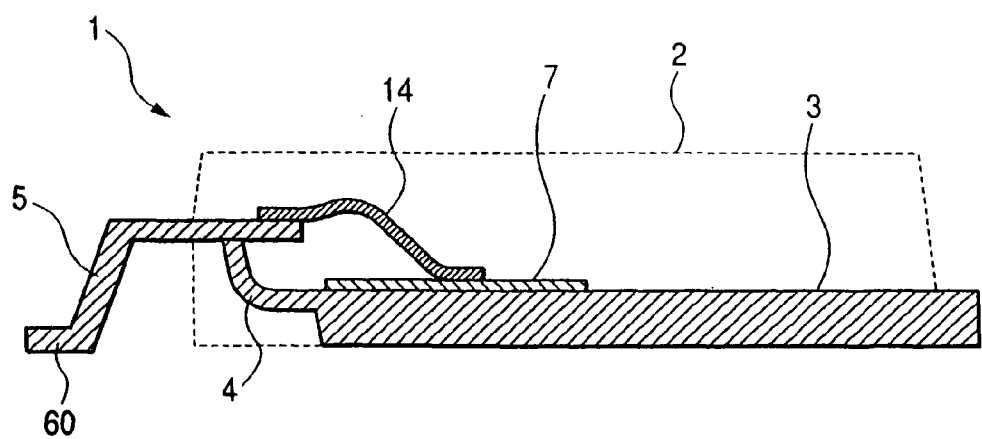
FIG. 22 is a schematic cross-sectional view of a semiconductor device according to another embodiment (embodiment 9) of the present invention.
Figure 23:
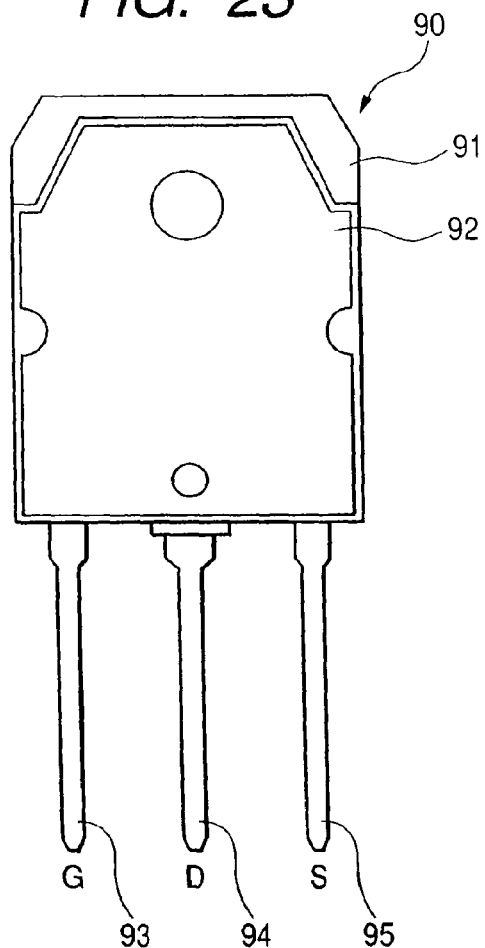
FIG. 23 is a schematic plan view of a conventional semiconductor device.
Figure 24:
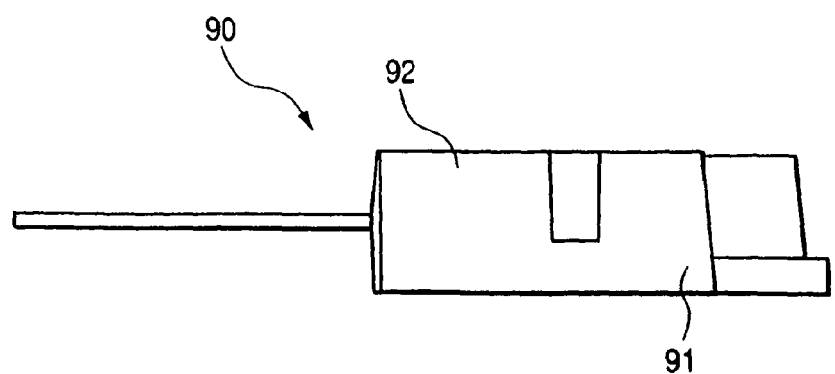
FIG. 24 is a side view of the semiconductor device shown in FIG. 23.
Figure 25:
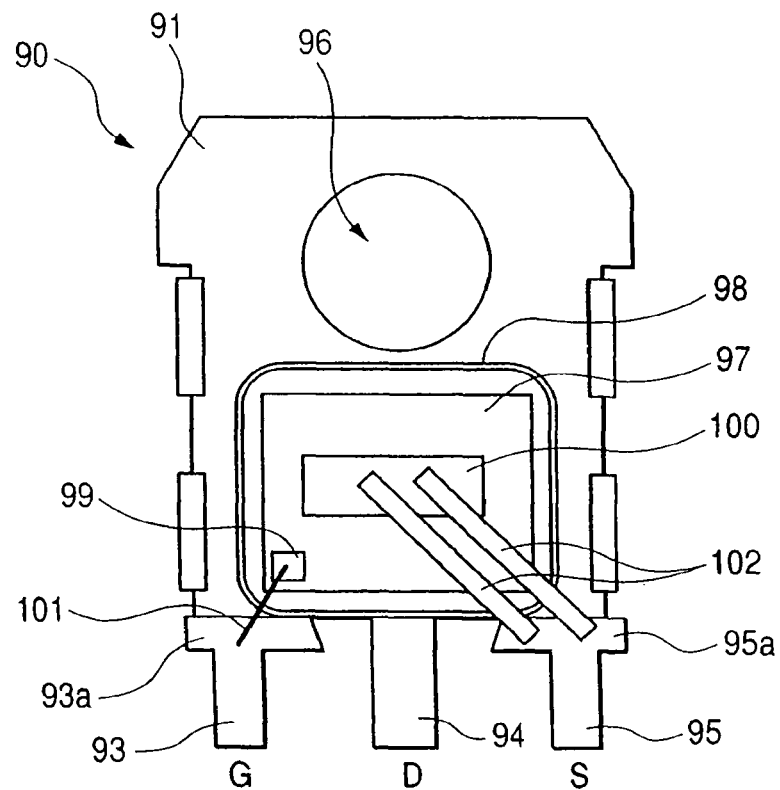
FIG. 25 is a schematic plan view of a semiconductor device in a state that a resin sealing body is removed before inventors have arrived at the present invention.
Figure 26:
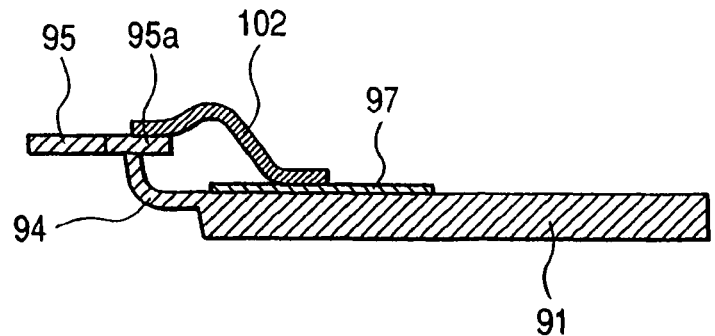
FIG. 26 is a cross-sectional view of the semiconductor device shown in FIG. 25.

FIG. 22 is a schematic cross-sectional view of a semiconductor device according to another embodiment (embodiment 9) of the present invention. This embodiment 9 is the modification of the embodiment 1 and the power transistor 1 of this embodiment 9 is characterized by the following structure. That is, three leads including the drain lead 4, the source lead 5 and the gate lead 6 which are projected from an end surface of a sealing body 2 are formed such that these three leads are bent in the midst portions and the distal ends of these leads extend from the lower surface of the support board 3 in a state that the distal ends are positioned at the substantially same height as the lower surface of the support board 3. With respect to extension portions 60 of the distal ends of these three leads 4, 5, 6, at the time of fixing the support board 3 to the mounting board 3 or the like of the power transistor 1, these extension portions 60 constitute connection portions with lines mounted on the mounting board. The power transistor 1 of the embodiment 9 has the surface mounting structure. Here, the drain lead 4 has the same potential as the support board 3 and hence, it may be possible to adopt the structure in which the drain lead 4 is cut at a proximal portion thereof projected from the sealing body 2 and hence is not connected to the mounting board. The power transistor 1 of this embodiment 8 can also obtain the similar advantageous effect as the power transistor 1 of the embodiment 1.

The invention made by the present inventor has been specifically explained based on the embodiments heretofore. However, the present invention is not limited to the above-mentioned embodiments and it is needless to say that various modifications can be made without departing from the gist of the present invention. Although, in the embodiments, the explanation has been made with respect to the example in which the power MOSFET which uses the first electrode, the second electrode and the control electrode as respective electrodes thereof is incorporated into the semiconductor chip, elements to be incorporated in the semiconductor chip may be a transistor such as power bipolar transistors, an IGBTs or the like or an IC including transistors. The present invention may be applied to at least a semiconductor device having TO-220 structure.

To explain advantageous effects obtained by typical inventions among the inventions disclosed in this specification, they are as follows.

(1) It is possible to provide the semiconductor device having the low ON resistance.

(2) It is also possible to provide the semiconductor device which can fix a semiconductor chip having a larger size to the support board and hence, the high-output semiconductor device can be provided.

What is claimed is:

1. A semiconductor device, comprising:
  a semiconductor chip including a field effect transistor and having a first main surface over which a source electrode and a gate electrode of the field effect transistor are formed and a second main surface opposite the first main surface over which a drain electrode of the field effect transistor is formed;
  a metal-made support board having a top surface over which the semiconductor chip is mounted such that the second main surface of the semiconductor chip faces the top surface of the metal made support board and a bottom surface opposite the top surface;
  a gate lead electrically connected to the gate electrode of the semiconductor chip via a gate wire;
  a source lead electrically connected to the source electrode of the semiconductor chip via a plurality of sources wires; and
  a sealing body sealing the semiconductor chip, the gate wire, the plurality of source wires, and a part of each of the gate and source leads, and
  wherein, in a plan view, the semiconductor chip has a quadrangular shape having a first chip side, a second chip side opposite the first chip side, a third chip side that intersects with the first and second chip sides, and a fourth chip side opposite the third chip side,
  wherein, in the plan view, the gate and source leads are disposed to be more proximate to the third chip side than each of the first, second, and fourth chip sides of the semiconductor chip,
  wherein, in the plan view, the gate electrode is disposed at a corner portion defined by the first and fourth chip sides of the semiconductor chip,
  wherein, in the plan view, the gate electrode is disposed to be more proximate to the fourth chip side than a respective connecting portion between each of the plurality of source wires and the source electrode in a first direction in which the first chip side extends, wherein, in the plane view, the gate electrode has a first gate side and a second gate side opposite the first gate side wherein, in the plan view, the first and second gate sides respectively face the first and second chip sides, wherein, in the plan view and in a second direction that is perpendicular to the first direction, the first gate side is located between the first chip side and the second gate side, and the second gate side is located between the first gate side and the second chip side, wherein the plurality of source wires includes a first source wire that is most proximate to the gate wire among the plurality of source wires, and wherein, in the plan view, the second gate side of the gate electrode is located in a range of a width in the second direction of an end portion of the first source wire of the respective connecting portion between the first source wire and the source electrode.

2. The semiconductor device according to claim 1, wherein, in the plan view, the respective connecting portions between the plurality of source wires and the source electrode are arranged in a staggered pattern relative to the fourth chip side in the first direction.

3. The semiconductor device according to claim 1, wherein, in the plan view, a width in a direction perpendicular to a direction in which each of the plurality of source wires extends is greater than a width in a direction perpendicular to a direction in which the gate wire extends.

4. The semiconductor device according to claim 1, wherein the bottom surface of the metal-made support board is not sealed with the sealing body.

5. The semiconductor device according to claim 1, wherein a step portion is formed at a circumference of the metal-made support board, and wherein the step portion is sealed with the sealing body.

6. The semiconductor device according to claim 1, wherein the plurality of source wires includes a second source wire and a third source wire, wherein, in the plan view and in the second direction, the first, second, and third source wires are disposed side by side to each other and the second source wire is disposed between the first and third source wires, and wherein, in the plan view and in the first direction, the respective connecting portion between each of the first and third source wires and the source electrode is more proximate to the fourth chip side of the semiconductor chip than the respective connecting portion between the second source wire and the source electrode.

7. The semiconductor device according to claim 6, wherein, in the plan view, the respective connecting portions between the first and third source wires and the source electrode are disposed at a same distance from the fourth chip side in the first direction.

* * * * *